United States Patent
Habuka et al.

(10) Patent No.: US 6,235,645 B1
(45) Date of Patent: May 22, 2001

(54) PROCESS FOR CLEANING SILICON SEMICONDUCTOR SUBSTRATES

(75) Inventors: Hitoshi Habuka; Toru Otsuka, both of Annaka (JP)

(73) Assignee: Shin Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/462,868

(22) PCT Filed: Jul. 17, 1998

(86) PCT No.: PCT/JP98/03228
§ 371 Date: Mar. 21, 2000
§ 102(e) Date: Mar. 21, 2000

(87) PCT Pub. No.: WO99/04420
PCT Pub. Date: Jan. 28, 1999

(30) Foreign Application Priority Data

Jul. 18, 1997 (JP) .................................................. 9-209713

(51) Int. Cl.[7] ..................................................... H01L 21/31
(52) U.S. Cl. .......................... 438/758; 438/700; 437/250; 510/175; 134/2
(58) Field of Search ..................................... 438/758, 700; 437/250; 134/2; 510/175

(56) References Cited

U.S. PATENT DOCUMENTS

| | | | |
|---|---|---|---|
| 4,973,563 | * 11/1990 | Prigge et al. ........................ | 437/225 |
| 5,129,955 | * 7/1992 | Tanaka ..................................... | 134/2 |
| 5,749,975 | * 5/1998 | Li et al. ................................. | 134/1.3 |
| 5,837,662 | * 11/1998 | Chai et al. ............................ | 510/175 |

* cited by examiner

Primary Examiner—Richard Elms
Assistant Examiner—Pho Luu
(74) Attorney, Agent, or Firm—Snider & Associates; Ronald R. Snider

(57) ABSTRACT

An object of the invention is to remove organic materials and metal impurities on a silicon-based semiconductor substrate while preventing regrowth of a natural oxide film and thermal diffusion of the metal impurities from occurring. In order to achieve the object, $H_2$ gas that can maintain a reductive atmosphere is consistently used, as a carrier gas, through a whole process, the organic materials in attachment is decomposed by HF gas and the metal impurities are transformed into metal chlorides by HCl gas. In any of treatments, since products whose vapor pressures are higher than those of respective starting materials are obtained, the products are respectively vaporized in a $H_2$ gas atmosphere at higher temperatures than those at which the decomposition and the transformation are performed. The whole process can be performed in a low temperature range whose upper limit is 1000° C. or lower. In a case where the impurities attach to an oxide film, the oxide film can be removed by HF gas treatment, in a preceding step of a process described above, in the temperature range of lower than 100° C. in which water adsorbed on or occluded in the oxide film can be retained, and in the case, if the HF treatment or the HCl treatment is performed from the initial stage of a process at a temperature of 100° C. or higher with no preceding step, the oxide film can be retained.

14 Claims, 1 Drawing Sheet

PROCESS FOR CLEANING SILICON SEMICONDUCTOR SUBSTRATES

TECHNICAL FIELD

This invention relates to a cleaning process for a silicon-based semiconductor substrate used for in semiconductor device fabrication by removing organic materials and metal impurities attaching to the surface of the substrate.

BACKGROUND ART

In the deep sub-micron generation in which design rules for a semiconductor device are ranged 0.3 to 0.2 $\mu$m, thicknesses of the gate oxide film of a MOS transistor and a tunnel insulating film of a flash memory are respectively reduced down to as small as 10 nm or less and of the order of tens of nanometers, and a conductive material film such as a polysilicon film or a metal film is deposited on such very thin insulating films to cover, thus forming an electrode. Further, in a case where a so-called epitaxial wafer is produced by growing a silicon single crystal thin film on a surface of a silicon-based semiconductor substrate, a natural oxide film and impurities present on the surface of a silicon-based semiconductor substrate have to be all removed.

In the processes, a cleanliness of and the presence of a natural oxide film on the silicon-based semiconductor substrate directly play a major role on the device performance. Therefore, when a semiconductor device is formed on a silicon-based semiconductor substrate, a surface thereof is necessary to be cleaned to a high degree while suppressing a damage on the surface of the substrate to the lowest degree possible. Unintentional attachment of impurities and growth of an oxide film, however, occur on a surface of a silicon-based semiconductor substrate in a polishing step, a cleaning step and the like of substrate manufacture and in the course of storage in the air. That is, there occur attachment of organic materials and metal impurities, or growth of a natural oxide film on the surface of a silicon-based semiconductor substrate. Below, description will be made of conventional general removal processes for such impurities and natural oxide film. Organic materials attaching to the surface of a silicon-based semiconductor substrate have origins thereof in silanol, a vinyl chloride-based plasticizer in a clean room and the like and in order to remove the organic materials, there have been available two ways in a broad sense: wet cleaning and dry cleaning.

A typical example of the wet cleaning is the so-called SC-1 cleaning in which an alkaline cleaning solution ($NH_4OH/H_2O_2/H_2O$) is used.

The dry cleaning, on the other hand, is typically performed in a high temperature treatment in an atmosphere of a hydrogen ($H_2$) gas or a mixed gas of $H_2$ gas and a hydrogen chloride (HCl) gas. In addition to this, an ozone ($O_3$) treatment, an ultraviolet irradiation treatment or a combination thereof have been known as a method that can be performed in the vicinity of room temperature. Among them, the high temperature treatment is advantageous in order to avoid regrowth of an oxide film. Among metal impurities attaching to a surface of silicon-based semiconductor substrate, metal impurities that are here regarded specifically problematic are heavy metals such as iron (Fe), nickel (Ni), chromium (Cr) and others. Such heavy metals are generally removed by the so-called SC-2 cleaning in which an acid cleaning liquid ($HCl/H_2H_2/H_2O$) is used, or alternatively the metals on and a surface region of the silicon-based semiconductor substrate are etched off together by holding the substrate in a $H_2$ atmosphere at as high as of the order of 1100° C. A process that is frequently employed in removal of a natural oxide film is to heat treat a substrate in an atmosphere constituted of $H_2$ or a gas mixture of $H_2$/HCl at a temperature as high as in the vicinity of 1100° C. In addition to this, as a process that can practically used in the vicinity of room temperature, there have been known wet etching using a dilute hydrofluoric acid solution, a combination of a dilute hydrofluoric acid treatment and a water vapor treatment and further, an Ar plasma treatment which is a dry treatment. However, various problems arise; an oxide film grows again immediately after removal of the natural oxide film, surface roughening of the substrate occurs, corrosion of a treatment facility and so on. Hence, the above described high temperature treatment is considered to be an optimal process at present. In a case where any of impurities is removed, however, when wet etching is adopted for the removal, pure water cleaning follows the wet etching in order to wash out a chemical liquid, further followed by drying and reattachment of impurities to a silicon-based semiconductor substrate cannot be avoided from occurring during the time the substrate is waiting for the next step after the drying. Further, there is also a risk that impurities attaching to a front surface of the silicon-based semiconductor substrate spread over to the rear surface through transportation by the chemical liquid and the cleaning water, which leads to a level at which impurity contamination widely affects the substrate.

In a process in which organic materials, metal impurities and a natural oxide film are removed by using $H_2$ gas or a mixed gas of $H_2$/HCl at a high temperature in the vicinity of 1100° C., a perfect removal of metal impurities, when the metal impurities are originally present on a surface of the substrate, has been hard to be achieved since the metal impurities are incorporated into the interior of the substrate by thermal diffusion. Especially, if a heavy metal is incorporated into the interior of silicon single crystal, the heavy metal works as causes for reduction of a carrier lifetime and formation of oxidation induced stacking faults. Therefore, the thermal diffusion as described above is required to be suppressed as much as possible.

In this way, it has conventionally been extremely difficult not only to suppress regrowth of a natural oxide film but also to prevent thermal diffusion of a metal impurity from occurring, both at the same time, and therefore, development of a process to simultaneously realize the suppression and prevention has been waited for. It is accordingly an object of the invention to provide such a cleaning process for a silicon-based semiconductor substrate.

DISCLOSURE OF INVENTION

The inventors have conducted serious studies to achieve the object and, as a result, have acquired findings that when organic materials attaching to a surface of a silicon-based semiconductor substrate are decomposed in an atmosphere including hydrogen fluoride gas and metal impurities attaching to the surface of the substrate are transformed into metal chlorides in an atmosphere including hydrogen chloride gas, products that have respectively high vapor pressures can be obtained from the organic materials and the metal impurities, with the result that the organic materials and the metal impurities each can be removed in a lower temperature range than that in a conventional case. Further, the inventor have also acquired other findings, in regard to a natural oxide film, that it is very effective in order to prevent regrowth of a natural oxide film from occurring that the film is removed in a highly reductive atmosphere using only a trace of water inherently included in the film as a reaction initiating catalyst. The invention has been proposed based on all such findings. That is, a cleaning process for a silicon-based semiconductor substrate of the invention is directed to a process in which an organic material attaching to a major surface of the substrate is removed and comprises: a first step of decomposing the organic material in an atmosphere including a mixed gas of HF gas and $H_2$ gas at a first temperature; and a second step of, after decomposition of the organic material, vaporizing a decomposition product formed in the first step in a $H_2$ gas atmosphere at a second temperature higher than the first temperature.

Further, a cleaning process of the invention is to set the first temperature in the range of from 0° C. to 600° C., both limits being included, and the second temperature in the range of 100° C. to 1000° C., both limits being included.

Still further, a cleaning process of the invention is that when the organic material attaches to a surface of an oxide film grown on the major surface of a silicon-based semiconductor substrate, the first temperature is set in the range of from 100° C. to 600° C., both limits being included, in at least a part of the first step and the second temperature is set in the range of from 100° C. to 900° C., both limits being included, thereby, retaining the oxide film on the substrate after the second step is finished. Yet further, a cleaning process of the invention is that when the organic material attaches to a surface of an oxide film grown on the major surface of a silicon-based semiconductor substrate, the oxide film is removed in an atmosphere including a mixed gas of hydrogen fluoride gas and hydrogen gas in the temperature range of from 0° C. to 100° C., the lower limit being included but the upper limit being not included, in a step preceding the first step.

Further, a cleaning process of the invention is directed to a process in which a metal impurity attaching to a major surface of a silicon-based semiconductor substrate is removed and comprises: a first step of transforming the metal impurity into a metal chloride in an atmosphere including a mixed gas of HCl gas and $H_2$ gas at a first temperature; and a second step of, after transformation of the metal impurity, vaporizing the metal chloride in a $H_2$ gas atmosphere at a second temperature higher than the first temperature.

Still further, a cleaning process of the invention is to set the first temperature in the range of from 0° C. to 1000° C., both limits being included, and the second temperature in the range of 100° C. to 1000° C., both limits being included. Yet further, a cleaning process of the invention is that when an organic material attaches to a surface of an oxide film grown on the major surface of a silicon-based semiconductor substrate, the first temperature is set in the range of from 0° C. to 900° C., both limits being included, and the second temperature is set in the range of from 100° C. to 900° C., both limits being included, thereby, retaining at least a part of the oxide film on the substrate after the second step is finished.

Further, a cleaning process of the invention is that when the metal impurity attaches to a surface of an oxide film grown on the major surface of a silicon-based semiconductor substrate, the oxide film is removed in an atmosphere including a mixed gas of hydrogen fluoride gas and hydrogen gas in the temperature range of from 0° C. to 100° C., the lower limit being included but the upper limit being not included, in a step preceding the first step.

Still further, a cleaning process for a silicon-based semiconductor substrate of the invention is directed to a process in which an organic material and a metal impurity attaching to a major surface of the substrate are sequentially removed and comprises: a first step of decomposing the organic material in an atmosphere including a mixed gas of HF gas and $H_2$ gas at a first temperature; a second step of, after decomposition of the organic material, vaporizing a decomposition product formed in the first step in a $H_2$ gas atmosphere at a second temperature higher than the first temperature; a third step of, after vaporization of the decomposition product, transforming the metal impurity into a metal chloride in an atmosphere including a mixed gas of HCl gas and $H_2$ gas at a third temperature higher than the second temperature; and a fourth step of, after transformation of the metal impurity, vaporizing the metal chloride formed in the third step in a $H_2$ gas atmosphere at a fourth temperature higher than the third temperature.

Yet further, a cleaning process of the invention is to set the first temperature in the range of from 0° C. to 500°C., both limits being included, the second temperature in the range of 100° C. to 800° C., both limits being included, the third temperature in the range of from 100° C. to 1000° C., both limits being included, and the fourth temperature in the range of 100° C. to 1000° C., both limits being included.

Further, a cleaning process of the invention is that when the organic material and the metal impurity attach to a surface of an oxide film grown on the major surface of a silicon-based semiconductor substrate, the oxide film is removed in an atmosphere including a mixed gas of HF gas and $H_2$ gas in the temperature range of from 0° C. to 100° C., the lower limit being included but the upper limit being not included, in a step preceding the first step.

BEST MODE TO CARRY OUT INVENTION

Figure 1:
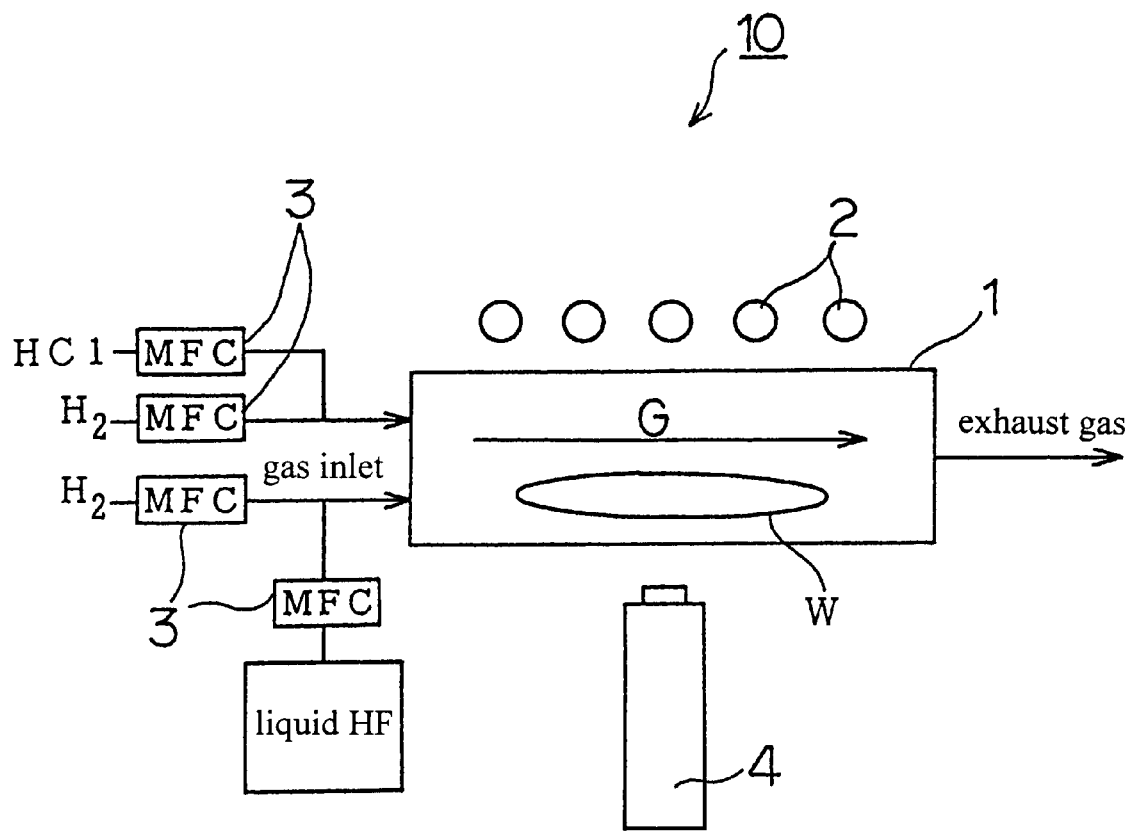
FIG. 1 is a schematic view showing a configuration example of a vapor phase treatment apparatus used in the invention.

Boiling points of many of organic materials and decomposition products thereof, and metal impurities attaching to a surface of silicon semiconductor crystal are in a much higher range than 1000° C., among which those whose melting points excess even 1000° C. are not few. In the invention, the organic materials are decomposed by using HF gas, while the metal impurities are transformed into metal chlorides by reacting with HCl, and thereby, the metal chlorides and decomposition products are given a necessary, sufficient vapor pressure for release from the surface of silicon semiconductor crystal even in a low temperature range whose upper limit is equal or lower than 1000° C., wherein all the process is performed in an atmosphere in which no regrowth of a natural oxide film occurs.

First, decomposition removal of organic materials will be described.

In the invention, a first temperature at which an organic material is decomposed in a $HF/H_2$ mixed gas atmosphere is preferably set in the range of from 0° C. to 600° C., both limits being included. In a range lower than the lower limit 0° C., no decomposition reaction of the organic material progresses, or if the reaction progresses, a decomposition speed is too slow to be actually adopted and therefore no practical throughput can be obtained. Contrary to this, in a range higher than the upper limit 600° C., the surface of silicon semiconductor crystal of a silicon-based semiconductor substrate is directly corroded by HF gas to increase its surface roughness, which makes the substrate not suitable for use in fabrication of a semiconductor device or epitaxial growth.

It is preferred that the second temperature in the second step in which the decomposition product is vaporized in the $H_2$ atmosphere is set in the range of 100° C. to 1000° C., both limits being included. No vaporization of the decomposition product occurs in a lower temperature range than the lower limit 100° C., while a surface of silicon single crystal of the silicon-based semiconductor substrate and an oxide, which is below described, are conspicuously etched by $H_2$ gas in a higher temperature range than the upper limit 1000° C. Further, if volatile impurities such as boron (B) and arsine (As) are doped in the silicon-based semiconductor substrate, vaporization of the dopants is intense so as to change resistivity of the substrate. It should be noted that a step may be provided between the first and second steps, where supply of HF gas is ceased and the atmosphere is replaced with a $H_2$ atmosphere, and the silicon-based semiconductor substrate is kept for a time at a temperature when the first step is terminated. In the mean time, it is conceivable that the organic materials do not necessarily attach to a surface of silicon single crystal but generally attaches rather to an oxide film grown on a major surface of a silicon based semiconductor substrate. The oxide film is exemplified as a natural oxide film, a thermal oxide, an oxide film deposited by means of thin film vapor deposition techniques such as CVD and sputtering, and a coat oxide film such as SOG (spin on glass).

A natural oxide film among the oxide films as described above is normally desired to be removed though it depends on a process, while a thermal oxide and other oxide films are normally desired to be retained.

Therefore, in the invention, another process is also proposed in which an oxide film is retained or removed by temperature control in the first step in which the organic materials are decomposed or in a preceding stage thereof. The process is controllable according to an etching mechanism for silicon oxide which is described below.

An etching removal reaction by HF gas of silicon oxide ($SiO_2$) in stoichiometry is expressed by the following reaction formula:

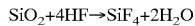

$$SiO_2 + 4HF \rightarrow SiF_4 + 2H_2O$$

The reaction actually requires a catalytic amount of water in the very initial stage. The reason supply of water is necessary only in the initial stage is that since $H_2O$ is produced once a reaction starts and an autocatalytic reaction proceeds thereafter. In other words, no etching of silicon oxide by HF progresses in a system where no water is absolutely on a surface of silicon oxide and no water is either contained in a vapor phase of the environment.

Considering the etching of an oxide film based on this fact, an oxide film in which water is inherently adsorbed on the surface or occluded in the interior thereof like a natural oxide film immediately after growth can be etched if HF is supplied to the oxide film in a comparatively low temperature range in which the water is held. However, after the water is all released from the oxide by receiving a heat treatment of some kind, any of the oxide film is not removed under supply of HF gas since no water as catalyst for the start of an etching reaction is present. A temperature at which an oxide film can retain water therein is in the temperature range of from 0° C. to 100° C., the lower limit being included but the upper limit being not included.

Therefore, in a case where an oxide film is desired to be retained while decomposing organic materials, it is only required that a process temperature is set in the range of from 100° C. to 600° C., both limits being included, and adsorbed and occluded water is removed in a first treatment in which organic materials are decomposed.

However, if a process temperature is raised to be equal to or higher than 900° C. even in the second step where only $H_2$ is supplied, an oxide film is etched to some extent. Therefore, the second temperature in the second step is necessary to be controlled in the range of from 100° C. to 900° C., both limits being included.

On the other hand, in a case where an oxide film is desired to be removed, a $HF/H_2$ mixed gas is supplied in the temperature range of from 0° C. to 100° C., the lower limit being included but the upper limit being not included prior to the first step and the oxide film is etched off using water, as a catalyst, retained on or in the oxide film a step preceding the first step. Further, in a treatment chamber of a vapor phase treatment apparatus for performing a dry treatment as described above, at least part of the wall surface is in many cases made from a quartz glass (silicon oxide). In the case, since adsorbed water on the surface of the quartz glass is almost perfectly eliminated by evacuation and baking (without substrate therein) prior to the use of the apparatus, there is no risk of etching the quartz wall surface even if HF gas is introduced into the treatment chamber.

In such a manner, if process conditions are set so that water inherently adsorbed on and occluded in a natural oxide film remains as they are while water is thoroughly removed from the environmental gas, only an natural oxide film can satisfactorily be removed with no corrosion of the apparatus, which is also a merit of the invention.

In the mean time, HF gas and $H_2$ gas used in the first step each can industrially be produced in a very pure state and can be available in a state in which almost neither water ($H_2O$) nor oxygen gas ($O_2$) is included, which is different from Ar gas and $N_2$ gas which have conventionally been used as a carrier gas a lot. Therefore, when a $HF/H_2$ mixed gas is used for removal of a natural oxide film, an exposed clean surface of a silicon-based semiconductor substrate can always be maintained in a reductive atmosphere and thereby, regrowth of an oxide film can be suppressed very satisfactorily.

Next, description will be made of removal of metal impurities. The first temperature is preferably set in the range of from 0° C. to 1000° C., both limits being included, in the first step in which the metal impurities are transformed into metal chlorides in a $HCl/H_2$ atmosphere. In a lower temperature range than the lower limit 0° C., a production reaction for a metal chloride does not proceed or, if the reaction proceeds, a production speed is too slow to be actually accepted and thereby a practical throughput cannot be obtained. Contrary to the above described, in a higher temperature range than the upper limit 1000° C., a surface of silicon single crystal of a silicon-based semiconductor substrate and the oxide film are conspicuously etched by $H_2$ gas. Further, HCl gas comes to conspicuously etch the surface of silicon single crystal of a silicon-based semiconductor substrate as well.

On the other hand, the second temperature is preferably set in the range of from 100° C. to 1000° C., both limits being included, in the second step in which the metal chlorides are vaporized. In a lower temperature range than the lower limit 100° C., a metal chloride does not vaporize, while in a higher temperature range than the upper limit 1000° C., a surface of silicon single crystal of a silicon-based semiconductor substrate and the oxide film are conspicuously etched by $H_2$ gas. Further, if volatile impurities such as boron (B) and arsine (As) are doped in the silicon-based semiconductor substrate, vaporization of the dopants is intense so as to change resistivity of the substrate. Boiling points of main metal chlorides are here listed up: zinc chloride ($ZnCl_2$)=756° C., aluminum trichloride ($AlCl_3$)=182° C. (sublimation), antimonypentachloride ($SbCl_5$)=102.5° C., indium trichloride ($InCl_3$)>500° C. (sublimation), cadmium chloride ($CdCl_2$)=980° C., chromium trichloride ($CrCl_3$)=950° C. (sublimation), tin tetrachloride ($SnCl_4$)=114° C., ferric chloride ($FeCl_3$)=280° C., lead dichloride ($PbCl_2$)=954° C., nickel dichloride ($NiCl_2$)=993° C. (sublimation) and molybdenum pentachloride ($MoCl_5$)=268° C.

In general, boiling points of many of metal fluorides are higher than the corresponding metal chlorides: to be exemplified, aluminum trifluoride ($AlF_3$)=1260° C. (sublimation), chromium trifluoride ($CrF_3$)=1300° C. and lead difluoride ($PbF_2$)=1292° C. Ferrous chloride has even a melting point of 1000° C. or higher. Therefore, heavy metals which are apt to be contaminants in a semiconductor fabrication process are preferably removed in the form of chlorides by transforming in a HCl gas atmosphere. It should be noted that a step may be provided between the first and second steps, where supply of HF gas is ceased and the atmosphere is made to be of a $H_2$ atmosphere, and the silicon-based semiconductor substrate is kept for a time at a temperature when the first step is terminated.

In a case where metal impurities attach to an oxide film, it can be considered in the following way whether or not the oxide is retained:

HCl gas, which is used for removal of the metal impurities, does not etch an oxide film, whereas $H_2$ gas, which is supplied as a carrier gas all time, starts etching of the oxide film in the temperature range of 900° C. or higher.

Therefore, when the oxide film is desired to be retained in this case, a process temperature in the first step is set in the range of from 0° C. to 900° C., both limits being included, and a process temperature in the second step is set in the range of from 100° C. to 900° C., both limits being included.

However, when the oxide film is desired to be efficiently removed by $H_2$ gas, there arises a necessity to removal of the oxide film using HF gas prior to formation of metal chlorides in the first step since an etching speed on a oxide film by $H_2$ gas is slow. A process temperature in the removal with HF gas is necessary to be set in the range of from 0° C. to 100° C., the lower limit being included but the upper limit being not included since the removal with HF gas is necessary to be performed in the temperature range in which the oxide film can retain water adsorbed on and occluded in itself as described above.

In the invention, another process can be adopted in which the organic materials and metal impurities are removed in consecutive steps. In the process, process flow goes in the following order: decomposition of the organic materials (a first step)→vaporization of decomposed products (a second step)→formation of metal chlorides (a third step)→removal of metal chlorides (a fourth step). Although the removal of organic materials and the removal of metal impurities may be reversed in the order in the process, the above detailed order is advantageous from the viewpoint of controllability of the process and a throughput since the silicon-based semiconductor substrate may only stepwise be heated to higher temperatures if process flow goes in the above detailed order. In the first step in which decomposition of the organic materials is performed, the first temperature is preferably set in the range of from 0° C. to 500° C., both limits being included. If the first temperature is higher than 500° C., the surface of silicon single crystal has a great risk to start surface roughening by HF gas.

In the second step in which the decomposition products are vaporized, the second temperature is preferably set in the range of from 100° C. to 800° C., both limits being included. If the second temperature is higher than 800° C., the metal impurities which should be removed has a great risk to diffuse into the interior of silicon single crystal.

In the third step in which the metal chlorides are formed, the third temperature is preferably set in the range of from 100° C. to 800° C., both limits being included. If the third temperature is higher than 800° C., the surface of silicon single crystal has a great risk to start surface roughening by HCl gas. In the fourth step in which the metal chlorides are vaporized, the fourth temperature is preferably set in the range of from 900° C. to 1000° C., both limits being included. If the fourth temperature is higher than 1000° C., the silicon single crystal and the oxide have a great risk that conspicuous etching thereof by $H_2$ gas arises.

Description will here be made of a configuration example of a vapor phase treatment apparatus that is used in a cleaning process for a silicon-based semiconductor substrate of the invention with reference to FIG. 1.

A wafer W is accommodated in a treatment chamber 1 in the vapor phase treatment apparatus 10. While one wafer W is placed in the FIGURE, a plurality of wafers may be placed instead. A gas G introduced from one end of the treatment chamber 1 is put into contact with the wafer W and thereafter, discharged from the other end of the treatment chamber 1. The gas G which flows through in the interior of the treatment chamber 1 is any one of $H_2$ gas only, HF gas diluted with $H_2$ gas and HCl gas diluted with $H_2$ gas, flow rates of the constituent gases are respectively controlled by mass flow controller 3 (MFC) in a precise manner and a gas G is introduced into the treatment chamber 1 under the control.

Further, although HF is a liquid in room temperature, it is supplied into the treatment chamber 1 as a vaporized component in a mixed gas with $H_2$ since it is easy to vaporize due to a large vapor pressure thereof.

Infrared lamps 2 are arranged outside the treatment chamber 10 along one major surface of the chamber and a heating temperature of the wafer W is controlled according to the power supply. Further, a radiation pyrometer 4 is disposed on the other major surface of the chamber, with which pyrometer 4 a wafer temperature during the process can be monitored.

It should be noted that, in the invention, cleaning and epitaxitial growth of a silicon single crystal thin film by means of the vapor phase treatment apparatus 10 can consecutively be performed in the apparatus if supply systems of a silicon compound and a dopant gas are added to the vapor phase treatment apparatus 10 since $H_2$ gas is used as a carrier gas through all the process, as described above. With the configuration applied, cleaning can be performed immediately before epitaxial growth and there is no necessity to transport the wafer W to another place between the steps of cleaning and epitaxial growth, so that reattachment of impurities can almost perfectly be suppressed. Therefore, an epitaxial wafer with good quality can be manufactured. As the silicon compound, there can be exemplified as follows: $SiCl_4$, $SiHCl_3$, $SiH_2Cl_2$, $SiH_4$ and as the dopant gas, there can be exemplified as follows: $B_2H_6$ and $PH_3$.

Examples of the invention will be described below:

EXAMPLE 1

In the example, organic materials attaching to a natural oxide film are removed using the vapor phase treatment apparatus 10 shown in FIG. 1 and a process in which a natural oxide film is retained will be described.

Wafers W used as samples were made from silicon single crystal with a diameter of 200 mm and a natural oxide film was formed thereon by leaving in a clean air for a full day. A thickness of the attaching film which attached to a surface of each wafer W was totally 1.3 nm, which film included a natural film 1.1 nm thick and an organic material film 0.2 nm thick. The thicknesses had been confirmed in advance by means of ellipsometry and X-ray photoelectron spectroscopy (XPS). Each wafer W was placed in the treatment chamber 1 in which the atmosphere was replaced with $H_2$ in advance, and temperature and a pressure were respectively maintained at 23° C. and 1 atm and the wafers W were heated to respective temperatures of 100° C., 300° C., 400° C., 500° C. and 600° C. When each wafer W was settled at one of the temperatures, 0.1% HF gas diluted with $H_2$ gas was supplied from one end of the treatment chamber 1 at a flow rate of 100 l/min for 1 min to decompose an organic material film. Then, HF gas is cut off, only $H_2$ gas was made to continuously flow, the wafer W was continuously heated for 10 min at the same temperature as when HF gas had been supplied and the wafer W was then heated for 10 min at a temperature high than when HF gas had been supplied by 200° C.

After heating at the higher temperature, the wafer W was cooled down to a room temperature by cutting off the power supply to the infrared lamps 2 while keeping only supply of $H_2$ gas in a continuously flowing state and after the cooling, the wafer W was taken out from the treatment chamber 1.

The surface of each wafer W was investigated by means of an XPS method. No photoelectron originating from a carbon atom which had been detected before the treatment was detected. Therefore, it was confirmed that the organic materials had been removed. Further, a thickness of the attaching film was measured by means of ellipsometry. The thickness of the film was found to be reduced by about 0.2 nm on any wafer of the temperatures as compared with when no treatment had been applied. The reduction in thickness of the film coincided with the thickness of the organic material film in the original state, which indicated that no damage had been given to the natural oxide film. This is considered because preheating of the wafers at 100° C. or higher was applied thereon and thereby, water which had been adsorbed on and occluded in the natural oxide film was removed, so that HF gas that was supplied to the wafers W would not react with silicon oxide.

It was also found that when HF gas was supplied at temperatures of 200° C., 300° C. and 400° C. among the 5 kinds of temperatures in decomposition of the organic material films, the organic materials were effectively decomposed and surface roughening of silicon single crystal was at a low level.

Further, while an organic material film was also removed when a temperature was raised to higher than 600° C., wafers processed under such conditions were improper for use in fabrication of a semiconductor device since the surface of silicon single crystal was etched by HF gas and the surface roughness was worsened. Therefore, it is especially preferred that the upper limit of a temperature at which organic materials are decomposed using HF gas is set to 600° C.

EXAMPLE 2

In the example, description will be made of a process in which a natural oxide film is removed by supplying HF gas while keeping temperatures of wafers W at room temperature, followed by a process in which organic materials are removed.

Wafers W that were used as samples were same as those used in Example 1. Each wafer W was placed in the treatment chamber 1 in which the atmosphere was replaced with $H_2$ in advance and temperature and a pressure were respectively maintained at 23° C. and 1 atm and 1% HF gas diluted with $H_2$ gas was made to flow from one end of the treatment chamber 1 at a flow rate of 100 l/min for 1 min to remove a natural oxide film.

A fact that a natural oxide film of each wafer W was removed was confirmed by means of ellipsometry.

The reason why a natural oxide film was removed in the example is that a temperature of each wafer W was kept at room temperature during supply of HF gas and thereby, release of water that was adsorbed on or occluded in the natural oxide film was prevented from occurring, so that the water was able to function as a initiating catalyst for an etching reaction of silicon oxide. After removal of the natural oxide film, the wafers W were heated to temperatures of from 100° C. to 600° C. similar to Example 1 and organic materials were decomposed using 0.1% HF gas diluted with $H_2$ gas at the temperatures, followed by evaporation of a decomposition product at a further raised temperature. A fact that the organic material film had been removed was confirmed by observation in which no photoelectron originating from a carbon atom was detected as a result of XPS measurement on the surface of the wafers W.

In such a manner, the wafers W, silicon single crystal of each of which is exposed in a clean state by removal of a natural oxide film thereon, are very preferable as substrates for epitaxial growth, for example.

EXAMPLE 3

In the example, description will be made of a process in which an organic film attaching to a thermal oxide film is removed. Wafers W used as samples were silicon single crystal substrates, placed in a high temperature oxygen atmosphere so as to form a thermal oxide film 200 nm thick on a surface of each of the wafers W and the wafers W each with the thermal oxide film thereon were further left in a clean air for a full day to form an organic material film 0.2 nm thick on the thermal oxide film. Similar to Example 1, the wafers W were in the following order subjected to steps of: raising temperature to in the range of from 100° C. to 600° C.; decomposition of organic materials by HF gas; holding in a $H_2$ atmosphere; raising temperature; and vaporization of a decomposition product in the $H_2$ atmosphere, whereby the organic material film was removed. A fact that the organic material film had been removed was confirmed by observation in which no photoelectron originating from a carbon atom was detected as a result of XPS measurement on the surface of the wafers W.

On the other hand, a fact that a thickness of a thermal oxide film of each wafer W was almost not reduced was confirmed by means of ellipsometry.

EXAMPLE 4

In the example, description will be made of a process in which metal impurities attaching to a natural oxide film is removed without giving any damage to the natural oxide film. Wafers W used as samples were silicon single crystal substrates each with a diameter of 200 mm and a natural oxide film 1.3 nm thick was formed on each wafer W by leaving the wafer W in a clean air for a full day with metal impurities attaching to the natural oxide film. The metal impurities were confirmed to be Fe, Ni and Cr by means of vapor phase decomposition atomic absorption spectrometry and any of concentrations was $1 \times 10^{10}/cm^2$.

Each wafer W was placed in the treatment chamber 1 in which the atmosphere was replaced with $H_2$ in advance, and temperature and a pressure were respectively maintained at 23° C. and 1 atm and the wafers W were heated to respective temperatures of 100° C., 400° C., 600° C. and 800° C. When each wafer W was settled at one of the temperatures, 1% HCl gas diluted with $H_2$ gas was supplied from one end of the treatment chamber 1 at a flow rate of 100 l/min for 1 min to form metal chlorides.

Then, HCl gas is cut off, only $H_2$ gas was made to continuously flow, the wafer W was continuously heated for 10 min at the same temperature as when HCl gas had been supplied and the wafer W was then heated for 10 min at a temperature higher than when HCl gas had been supplied by 200° C.

After heating at the higher temperature, the wafer W was cooled down to a room temperature by cutting off the power supply to the infrared lamps 2 while keeping only $H_2$ gas in a continuously flowing state and after the cooling, the wafer W was taken out from the treatment chamber 1.

The wafers W taken out were measured on concentrations of metal impurities attaching to a surface of each wafer by vapor phase decomposition atomic absorption spectrometry and the concentrations of metal impurities were recognized to be reduced on each of the wafers W of the respective temperatures. Especially the measurement results about a wafer W processed in conditions that a temperature at which HCl gas was contacted was 800° C. and a temperature at which heating in $H_2$ gas was performed was 1000° C. were as follows: Fe concentration=$1 \times 10^9/cm^2$, Ni concentration= $1.5 \times 10^9/cm^2$ and Cr concentration=$1 \times 10^9/cm^2$, by which it was confirmed that the concentrations were all deceased by one order of magnitude as compared with before receiving the treatments of the process.

Further, a thickness of a natural oxide film on each wafer was measured by ellipsometry and the thickness of the film did not change as compared with before the treatments of the process. Therefore, it was confirmed that almost no damage was given to a natural oxide film as far as the above described temperature range was employed in the process.

Further, a process was applied to wafers W for comparison purposes, in which process a temperature at which HCl gas was supplied was 1000° C. and each wafer W was maintained at the same temperature in a $H_2$ atmosphere for 10 min after HCl gas was cut off. Metal impurities on each wafer W were removed to similar levels to the above described, but reduction in thickness of a natural oxide film due to action of high temperature $H_2$ gas was recognized. When HCl gas was supplied at 900° C., no damage on the natural oxide film was observed. Therefore, when metal impurities are desired to be removed while a natural oxide film is retained, it is only required that a temperature at which HCl is supplied is set to a temperature of 900° C. or lower.

EXAMPLE 5

In the example, description will be made of a process in which HF gas is supplied while a temperature of a wafer is held at room temperature to remove a natural oxide film, followed by removal of metal impurities.

Wafers W used as samples were same as those used in Example 4 and Fe, Ni and Cr were present on a natural oxide film 1.3 nm thick all at a concentration of $1 \times 10^{10}/cm^2$.

Each wafer W was placed in the treatment chamber 1 in which the atmosphere was replaced with $H_2$ in advance, and temperature and a pressure were respectively maintained at 23° C. and 1 atm and 1% HF gas diluted with $H_2$ gas was supplied from one end of the treatment chamber 1 at a flow rate of 100 l/min for 5 min to remove a natural oxide film.

A fact that the natural oxide film had been removed was here recognized by ellipsometry.

However, it was found from measurements by means of vapor phase decomposition atomic absorption spectrometry that there arose no change in concentration of metal impurities at this stage. Then, similar to Example 4, the wafers W were heated to respective temperatures of from 100° C. to 800° C. and metal impurities on each wafer W were transformed into metal chlorides using 1% HCl gas diluted with $H_2$ gas and after the transformation, the wafer was further heated to a temperature higher than the temperature at which the HCl gas was supplied by 200° C. to vaporize decomposition products.

As a result, it was recognized that concentrations of respective metal impurities were all reduced by one order of magnitude at any of the temperatures.

EXAMPLE 6

In the example, description will be made of a process in which metal impurities attaching to a thermal oxide film were removed. Wafers W used as samples were silicon crystal substrates, a thermal oxide film 200 nm thick was formed on a surface of each wafer by holding the wafer in a high temperature oxygen atmosphere and the wafers W were left in a clean air for a full day. Fe, Ni and Cr were present on the thermal oxide film all at $1 \times 10^{10}/cm^2$.

Similar to Example 5, the wafers W were in the following order subjected to the steps of: raising temperature to respective temperatures of from 100° C. to 800° C.; formation of metal chlorides by HCl gas; holding in a $H_2$ atmosphere; raising temperature; and vaporization of the metal chlorides, whereby, the metal impurities were removed.

The wafers W were analyzed by means of vapor phase decomposition atomic absorption spectrometry and it was recognized that concentrations of the metal impurities were decreased by one order of magnitude on all the wafers W which had been treated at the respective temperatures of from 100° C. to 800° C. On the other hand, it was recognized from measurements by means of ellipsometry that there was almost no change in thickness of the thermal oxide film.

EXAMPLE 7

In the example, description will be made of a process in which a series of steps including removal of a natural oxide film, removal of an organic material film and removal of metal impurities are consecutively performed in the order and thereby, obtaining a wafer whose ideal surface of silicon single crystal was exposed.

Wafers W used as samples were same as those used in Example 4. Each wafer W was placed in the treatment chamber 1 of the vapor phase treatment apparatus 10 whose interior is filled with a $H_2$ gas atmosphere and in which a temperature and a pressure were respectively maintained at 23° C. and 1 atm, and subsequent to placement of the wafer W, 1% HF gas diluted with $H_2$ gas was supplied to the treatment chamber 1 at a flow rate of 100 l/min for 5 min to remove a natural oxide film.

Then, the wafer W was heated to 500° C. in a $H_2$ gas atmosphere and 1% HF gas diluted with $H_2$ gas was supplied at a flow rate of 100 l/min for 1 min to decompose the organic material film. Following decomposition of the organic material film, the wafer W was heated to 600° C. in a H$_2$ atmosphere and held at the temperature for 10 min to vaporize a decomposition product. It was recognized by means of XPS and ellipsometry that an organic material film had been removed from a surface of the wafer at this stage.

Following vaporization of the decomposition product, the wafer W is heated to 800° C. in a H$_2$ atmosphere and 1% HCl gas diluted with H$_2$ gas was supplied at a flow rate of 100 l/min for 1 min to transform metal impurities into metal chlorides. Following to transformation of the metal impurities, the wafer W was heated to 1000° C. in a H$_2$ atmosphere and held at the temperature for 10 min in the atmosphere to vaporize the metal chlorides.

It was recognized by vapor phase decomposition atomic absorption spectrometry that concentrations of the metal impurities on a surface of the wafer W had been reduced by one order of magnitude at this stage.

Since metal fluorides are generally high in boiling point and low in vapor pressure as compared with the metal chlorides corresponding, therefore it was worried that the metal impurities would be transformed into metal fluorides corresponding in HF treatment step which was employed for decomposition of an organic material thin film and thereby, the metal impurities would eventually be hard to be removed if an organic material film and metal impurities coexisted together in Example 1 to 3, which are described above. However, since the metal impurities were able to be effectively decreased in Example 7, it was actually proved that it causes no problem in removal of metal impurities that a natural oxide film and an organic material film are removed prior to removal of metal impurities.

While the invention is above described based on 7 examples, the invention is not limited to the example. For example, details of a material and dimensions of a wafer, and vapor phase treatment conditions such as decomposition of organic materials, vaporization of the decomposition products, formation of metal chlorides and vaporization of the metal chlorides can properly be altered, selected and combined.

Further, while descriptions are made of the processes in which impurities are removed from a thermal oxide film having a comparatively large thickness without giving any damage thereon in Examples 3 and 6 described above, a like process can also be applied to a very thin thermal oxide film as thin as of the order of from several nm to tens of nm such as a gate oxide film and a tunnel insulating film. Therefore, the invention is very significant as a cleaning process for a substrate surface prior to formation of a gate electrode.

In addition, in a case where a clean surface of silicon single crystal is eventually obtained as in Examples 2, 4, 5 and 7, a high quality epitaxial wafer can be manufactured by performing epitaxial growth in a consecutive manner immediately after the above vapor phase treatments.

As is apparent from the above descriptions, according to the invention, organic materials and metal impurities on a surface are transformed into compounds each having a high vapor pressure using a low-priced, easily available gas such as HF gas and HCl gas and further the compounds transformed can be heat removed with ease in treatments in a low temperature range compared with conventional conditions. Therefore, even if metal impurities are originally present on a substrate surface, there arises no chance of the impurities being incorporated into the interior of a substrate by thermal diffusion.

Further, in the invention, since a H$_2$ gas is consistently used through the whole process as a carrier gas for a series of vapor treatments, no regrowth of an oxide film occurs on a surface of silicon single crystal that has once been exposed and, for example, in a case where a silicon single crystal thin film is epitaxially grown in the next step following a process of the invention, a very good substrate can be provided for the growth. Further, by controlling a heating temperature at an initial stage of a case of performing HF gas treatment, even when an underlying material of organic material and metal impurities is an oxide film, a large etch selectivity can be ensured for the oxide film. Therefore, surfaces of a gate oxide film and a tunnel insulating film, both very small in thickness, can be cleaned, thereby enabling performances of a MOS transistor and a flash memory to be improved.

What is claimed is:

1. A cleaning process for a silicon-based semiconductor substrate comprising: a first step of decomposing an organic material attaching to a major surface of the substrate in an atmosphere including a mixed gas of hydrogen fluoride gas and hydrogen gas at a first temperature;

and a second step of vaporizing a decomposition product formed in the first step in a hydrogen gas atmosphere at a second temperature higher than the first temperature.

2. A cleaning process for a silicon-based semiconductor substrate according to claim 1, wherein the first temperature is set in the range of from 0° C. to 600° C., both limits being included, and the second temperature is set in the range of 100° C. to 1000° C., both limits being included.

3. A cleaning process for a silicon-based semiconductor substrate according to claim 2, wherein when the organic material attaches to a surface of an oxide film grown on the major surface of the substrate, the first temperature is set in the range of from 100° C. to 600° C., both limits being included, and the second temperature is set in the range of from 100° C. to 900° C., both limits being included, thereby, retaining the oxide film on the substrate after the second step is finished.

4. A cleaning process for a silicon-based semiconductor substrate according to claim 2, wherein when the organic material attaches to the surface of an oxide film grown on the major surface of the substrate, the oxide film is removed in an atmosphere including a mixed gas of hydrogen fluoride gas and hydrogen gas in the temperature range of from 0° C. to 100° C., the lower limit being included but the upper limit being not included, in a step preceding the first step.

5. A cleaning process for a silicon-based semiconductor substrate according to claim 1, wherein the cleaning is performed immediately before epitaxial growth.

6. A cleaning process for a silicon-based semiconductor substrate comprising: a first step of transforming a metal impurity attaching to a major surface of the substrate into a metal chloride in an atmosphere including a mixed gas of hydrogen chloride gas and hydrogen gas at a first temperature; and a second step of vaporizing the metal chloride formed in the first step in a hydrogen gas atmosphere at a second temperature higher than the first temperature.

7. A cleaning process for a silicon-based semiconductor substrate according to claim 6, wherein the first temperature is set in the range of from 0° C. to 1000° C., both limits being included, and the second temperature is set in the range of 100° C. to 1000° C., both limits being included.

8. A cleaning process for a silicon-based semiconductor substrate according to claim 7, wherein when an organic material attaches on a surface of an oxide film grown on the major surface of the substrate, the first temperature is set in the range of from 0° C. to 900° C., both limits being included, and the second temperature is set in the range of from 100° C. to 900° C., both limits being included, thereby, retaining at least a part of the oxide film on the substrate after the second step is finished.

9. A cleaning process for a silicon-based semiconductor substrate according to claim 5, wherein when the metal impurity attaches to a surface of an oxide film grown on the major surface of the substrate, the oxide film is removed in an atmosphere including a mixed gas of hydrogen fluoride gas and hydrogen gas in the temperature range of from 0° C. to 100° C., the lower limit being included but the upper limit being not included, in a step preceding the first step.

10. A cleaning process for a silicon-based semiconductor substrate according to claim 6, wherein the cleaning is performed immediately before epitaxial growth.

11. A cleaning process for a silicon-based semiconductor substrate in which an organic material and a metal impurity attaching to a major surface of the substrate are sequentially removed, comprising:

a first step of decomposing the organic material in an atmosphere including a mixed gas of hydrogen fluoride gas and hydrogen gas at a first temperature;

a second step of vaporizing a decomposition product formed in the first step in a hydrogen gas atmosphere at a second temperature higher than the first temperature;

a third step of transforming the metal impurity into a metal chloride in an atmosphere including a mixed gas of hydrogen chloride gas and hydrogen gas at a third temperature higher than the second temperature;

and a fourth step of vaporizing the metal chloride formed in the third step in a hydrogen gas atmosphere at a fourth temperature higher than the third temperature.

12. A cleaning process for a silicon-based semiconductor substrate according to claim 11, wherein the first temperature is set in the range of from 0° C. to 600° C., both limits being included, the second temperature is set in the range of 100° C. to 1000° C., both limits being included, the third temperature is set in the range of from 100° C. to 800° C., both limits being included, and the fourth temperature is set in the range of 100° C. to 1000° C., both limits being included.

13. A cleaning process for a silicon-based semiconductor substrate according to claim 12, wherein when the organic material and the metal impurity attach to a surface of an oxide film grown on the major surface of the substrate, the oxide film is removed in an atmosphere including a mixed gas of hydrogen fluoride gas and hydrogen gas in the temperature range of from 0° C. to 100° C., the lower limit being included but the upper limit being not included, in a step preceding the first step.

14. A cleaning process for a silicon-based semiconductor substrate according to claim 11, wherein the cleaning is performed immediately before epitaxial growth.

* * * * *